(12) United States Patent
Um

(10) Patent No.: US 11,314,652 B2
(45) Date of Patent: Apr. 26, 2022

(54) MEMORY CONTROLLER AND METHOD OF OPERATING THE SAME

(71) Applicant: SK hynix Inc., Gyeonggi-do (KR)

(72) Inventor: Gi Pyo Um, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/991,620

(22) Filed: Aug. 12, 2020

(65) Prior Publication Data

US 2021/0271603 A1 Sep. 2, 2021

(30) Foreign Application Priority Data

Mar. 2, 2020 (KR) .................. 10-2020-0026228

(51) Int. Cl.
| | | |
|---|---|---|
| G06F 12/0877 | (2016.01) | |
| G06F 12/0811 | (2016.01) | |
| G06F 13/16 | (2006.01) | |
| G11C 16/32 | (2006.01) | |
| G11C 16/10 | (2006.01) | |
| G11C 16/26 | (2006.01) | |
| G06F 9/30 | (2018.01) | |

(52) U.S. Cl.
CPC ...... *G06F 12/0877* (2013.01); *G06F 9/30189* (2013.01); *G06F 12/0811* (2013.01); *G06F 13/1673* (2013.01); *G11C 16/10* (2013.01); *G11C 16/26* (2013.01); *G11C 16/32* (2013.01)

(58) Field of Classification Search
None
See application file for complete search history.

(56) References Cited

U.S. PATENT DOCUMENTS

| | | | |
|---|---|---|---|
| 2015/0253998 A1* | 9/2015 | Park | G06F 3/068 |
| | | | 711/103 |
| 2020/0310645 A1* | 10/2020 | Li | G06F 3/064 |

FOREIGN PATENT DOCUMENTS

| | | |
|---|---|---|
| KR | 10-0878479 | 1/2009 |
| KR | 10-2013-0028349 | 3/2013 |
| KR | 10-2014-0099999 | 8/2014 |
| KR | 10-2016-0094765 | 8/2016 |
| KR | 10-2018-0049148 | 5/2018 |
| KR | 10-2021-0077443 A | 6/2021 |

\* cited by examiner

*Primary Examiner* — James G Norman
(74) *Attorney, Agent, or Firm* — IP & T Group LLP

(57) ABSTRACT

The present technology relates to an electronic device. A memory controller controls a memory device to efficiently use a storage space of the memory device. The memory controller controlling the memory device includes a cache buffer configured to store data received from a host and output the data to the memory device, and a program mode setting component configured to determine a program mode based on a size of the data output from the cache buffer to the memory device, and output an address and a command according to the determined program mode.

20 Claims, 14 Drawing Sheets

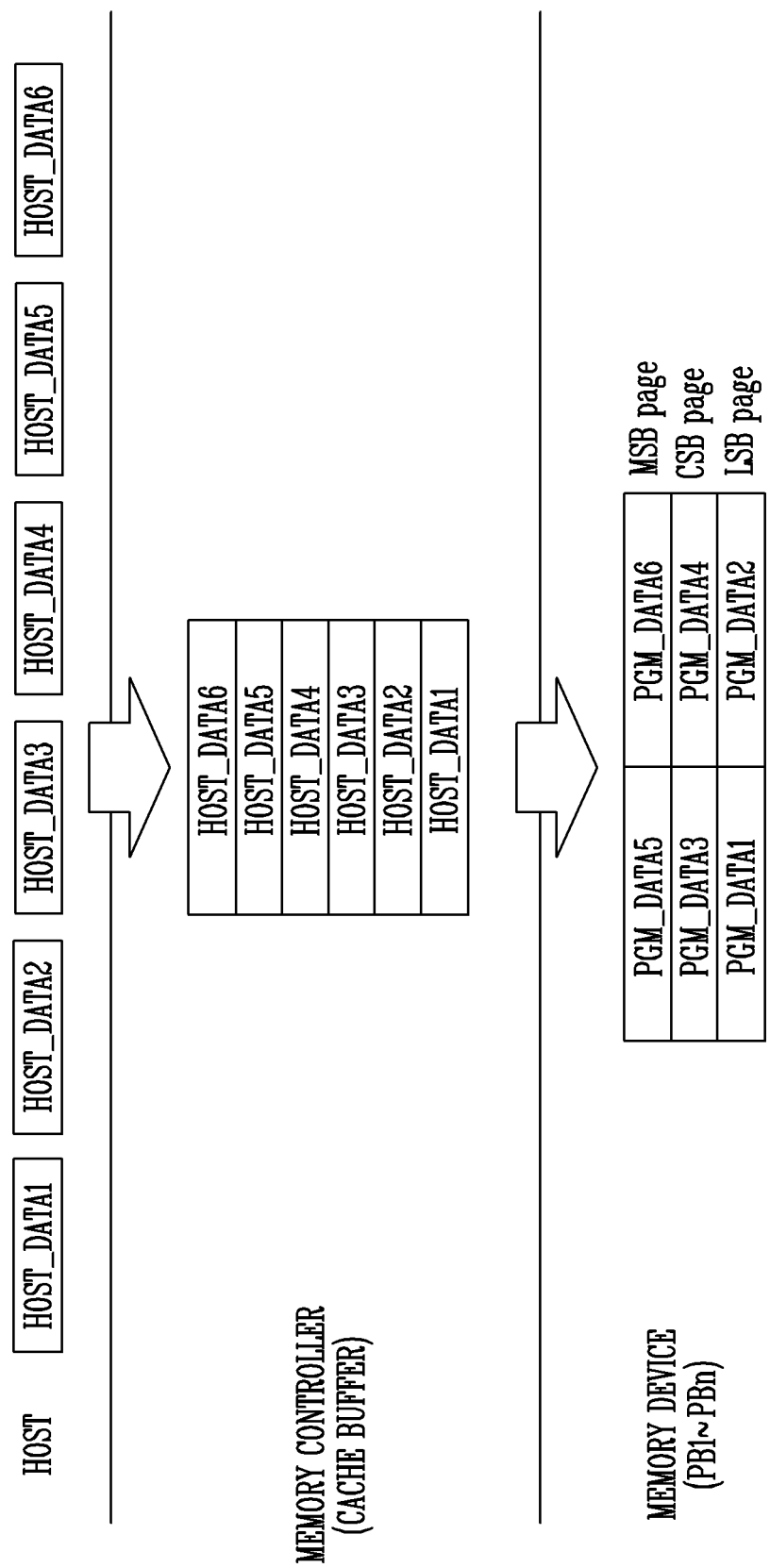

| | | |
|---|---|---|
| | | MSB page |
| | | CSB page |
| PGM_DATA1 | PGM_DATA2 | LSB page |

| | | |
|---|---|---|
| | | MSB page |
| PGM_DATA3 | | CSB page |
| PGM_DATA1 | PGM_DATA2 | LSB page |

| | | |
|---|---|---|
| PGM_DATA5 | | MSB page |
| PGM_DATA3 | PGM_DATA4 | CSB page |
| PGM_DATA1 | PGM_DATA2 | LSB page |

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2020-0026228, filed on Mar. 2, 2020, which is incorporated herein by reference in its entirety.

BACKGROUND

1. Field of Invention

The present disclosure relates to an electronic device, and more particularly, to a memory controller and a method of operating the same.

2. Description of Related Art

A storage device stores data under control of a host device such as a computer, a smart phone, or a smart pad. The storage device may be of a type that stores data in a magnetic disk such as a hard disk drive (HDD), or of a type that stores data in a semiconductor memory such as a solid state drive (SSD), or a memory card, in particular, a non-volatile memory.

A storage device may include a memory device in which data is stored and a memory controller that stores data in the memory device. A memory device may be a volatile memory or a non-volatile memory. Examples of a non-volatile memory include a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), and a ferroelectric RAM (FRAM).

SUMMARY

An embodiment of the present disclosure provides a memory controller and a method of operating the same, which controls a memory device to efficiently use a space of the memory device.

A memory controller according to an embodiment of the present disclosure controls a memory device. The memory controller may include a cache buffer configured to store data received from a host and output the data to the memory device, and a program mode setting component configured to determine a program mode based on a size of the data output from the cache buffer to the memory device, and output an address and a command according to the determined program mode.

A method of operating a memory controller according to an embodiment of the present disclosure is a method of operating a memory controller that controls a memory device. The method may include storing data received from a host, outputting the stored data to the memory device, determining a program mode based on a size of the data output to the memory device, and outputting to the memory device an address and a command according to the determined program mode.

An operating method of a controller according to an embodiment of the present disclosure may include controlling a memory device to buffer data in a page buffer therein; and controlling, by providing the memory device with an address immediately before a confirm command, the memory device to program the buffered data in one of a single level cell method and a triple level cell method depending on a size of the buffered data at a time of the programming.

According to embodiments of the present invention, a space of the memory device may be efficiently used by selecting an area in which data is to be stored according to a size of data stored in a page buffer.

BRIEF DESCRIPTION OF THE DRAWINGS

FIG. 8 is a diagram illustrating data transmission between a host, a memory controller, and a memory device, such as that of FIG. 1.

DETAILED DESCRIPTION

Specific structural and functional description provided herein is directed to embodiments of the present invention. However, features and aspects of the present invention may be configured and/or carried out in various other ways. Thus, the present invention is not limited to or by any of the disclosed embodiments nor to or by any particular detail described herein. Also, throughout the specification, reference to "an embodiment," "another embodiment" or the like is not necessarily to only one embodiment, and different references to any such phrase are not necessarily to the same embodiment(s).

Figure 1:
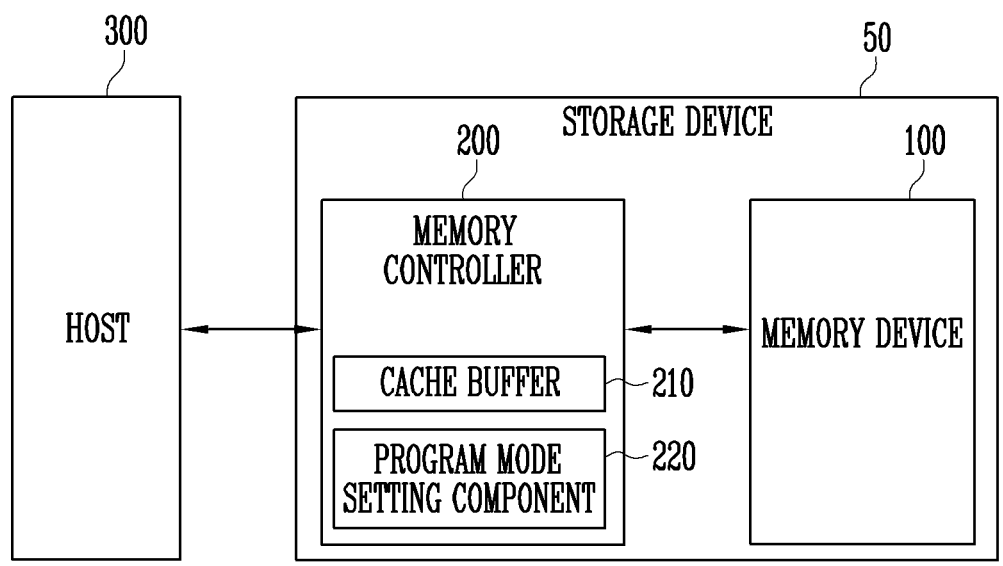
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be configured as any of various types of storage devices according to a host interface that is a communication method with the host 300. For example, the storage device 50 may be configured as any of an SSD, a multimedia card in a form of an MMC, an eMMC, an RS-MMC and a micro-MMC, a secure digital card in a form of an SD, a mini-SD and a micro-SD, an universal serial bus (USB) storage device, an universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any of a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, by way of example, features and aspects of the present invention are described in the context in which the memory device 100 is a NAND flash memory.

The memory device 100 may be implemented as a two-dimensional array structure or a three-dimensional array structure. Hereinafter, the three-dimensional array structure is described as an embodiment, but the present invention is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a SLC method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write operation (program operation), a read operation, or an erase operation according to the received command. For example, when a program command is received, the memory device 100 may program data to the area selected by the address. When a read command is received, the memory device 100 may read data from the area selected by the address. When an erase command is received, the memory device 100 may erase data stored in the area selected by the address.

The memory controller 200 may control overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data in the memory device 100 is to be stored. In addition, the memory controller 200 may store a logical-physical address mapping table configuring a mapping relationship between the LBA and the PBA in a buffer memory.

The memory controller 200 may control the memory device 100 to perform a program operation, a read operation, an erase operation, or the like according to a request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit a program command, address, and data to the memory device 100 without a corresponding request from the host 300. For example, the memory controller 200 may autonomously provide a command, an address, and data to the memory device 100 so as to perform any of various background operations such as a wear leveling operation and a garbage collection operation.

The memory controller 200 may include a cache buffer 210. The cache buffer 210 may temporarily store host data received from the host 300. The host data may be program data to be programmed in the memory device 100.

In an embodiment, when a size of the host data stored in the cache buffer 210 is equal to or greater than a certain size, the host data stored in the cache buffer 210 may be output to the memory device 100 as program data. Alternatively, when a certain time elapses after the host data is stored in the cache buffer 210, the host data may be output to the memory device 100 as program data piece-by-piece in the order in which the pieces of host data were stored in the cache buffer 210.

In the present disclosure, after the host data is stored in the cache buffer 210, the host data may be output piece-by-piece in the order in which the host data was stored in the cache buffer 210. Here, the host data may be output from the cache buffer 210 as program data. The program data output from the cache buffer 210 may be stored in a page buffer of the memory device 100. A program mode may be determined based on the data stored in the page buffer.

The program mode may be any one of a single level cell (SLC) mode in which a program operation is performed in a SLC method or the TLC mode in which the program operation is performed in a TLC method.

The memory controller 200 may include a program mode setting component 220. The program mode setting component 220 may set a method of programming data in the memory device 100, that is, the program mode. The program mode setting component 220 may set the program mode based on the size of the data stored in the page buffer.

In an embodiment, when the data stored in the page buffer is of such a size that it is programmable in the SLC method, the program mode setting component 220 may set the program mode in the SLC mode. When the program mode is set to the SLC mode, data transmitted to the memory device 100 may be programmed in the SLC method.

In an embodiment, the initial or default program mode of the memory device 100 may be the TLC mode. Therefore, first, the memory device 100 may perform the program operation in the TLC method.

However, when the data stored in the page buffer becomes a size that is programmable in the SLC method while the memory device 100 performs the program operation in the TLC method, the program mode setting component 220 may switch the program mode to the SLC mode. When the program mode is set to the SLC mode, the data transmitted to the memory device 100 may be programmed in the SLC method.

Thereafter, when the size of the data stored in the page buffer is not (or no longer) programmable in the SLC method, the program mode setting component 220 may set or switch the program mode to the TLC mode again. When the program mode is set to the TLC mode, the data transmitted to the memory device 100 may be programmed in the TLC method.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), and/or Rambus dynamic random access memory (DRAM), or a static random access memory (SRAM).

In various embodiments, the buffer memory may be a separate component that is connected to the storage device 50. In this case, one or more external volatile memory devices each connected to the storage device 50 may serve as the buffer memory.

In an embodiment, the memory controller 200 may control two or more memory devices. In this case, the memory controller 200 may control the memory devices according to an interleaving method in order to improve operation performance.

The host 300 may communicate with the storage device 50 using at least one of various communication methods such as an universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), an universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
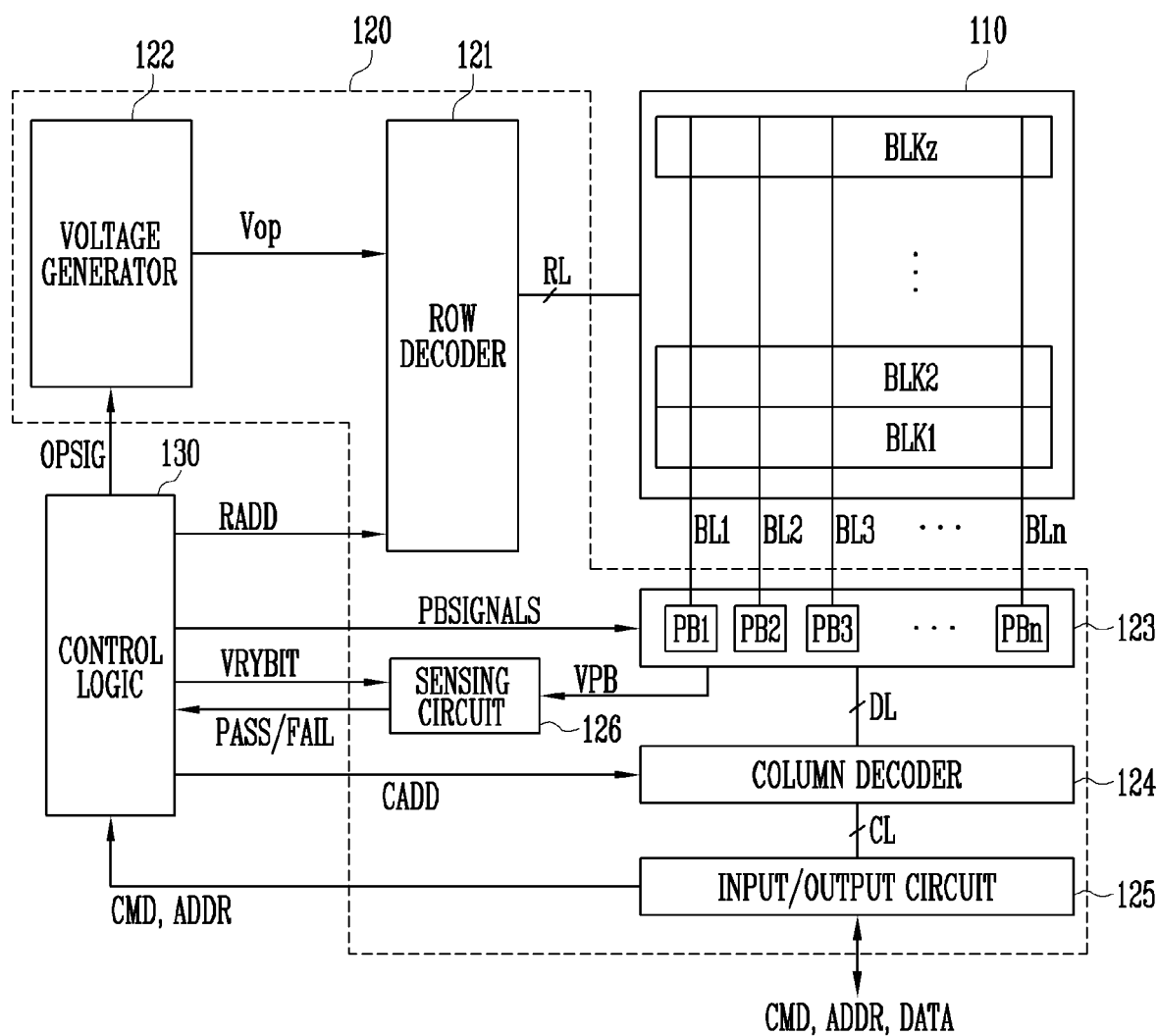
FIG. 2 is diagram illustrating a structure of a memory device, such as that of FIG. 1.

FIG. 2 is diagram illustrating a structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells in the memory cell array 110 may be configured as a single level cell (SLC) that stores one data bit, a multi-level cell (MLC) that stores two data bits, the TLC that stores three data bits, or a quadruple level cell (QLC) that stores four data bits.

The peripheral circuit 120 may be configured to perform a program operation, a read operation, or an erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during a program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During a read operation, the row decoder 121 may apply a read voltage to the selected word line and apply a read pass voltage higher than the read voltage to the unselected word line.

In an embodiment, an erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn, which are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL.

The memory cells in the memory cell array 110 may be programmed to any one of a plurality of program states according to data stored in each memory cell. A target program state of the memory cell may be determined as any one of the plurality of program states according to data to be stored.

Figure 3:
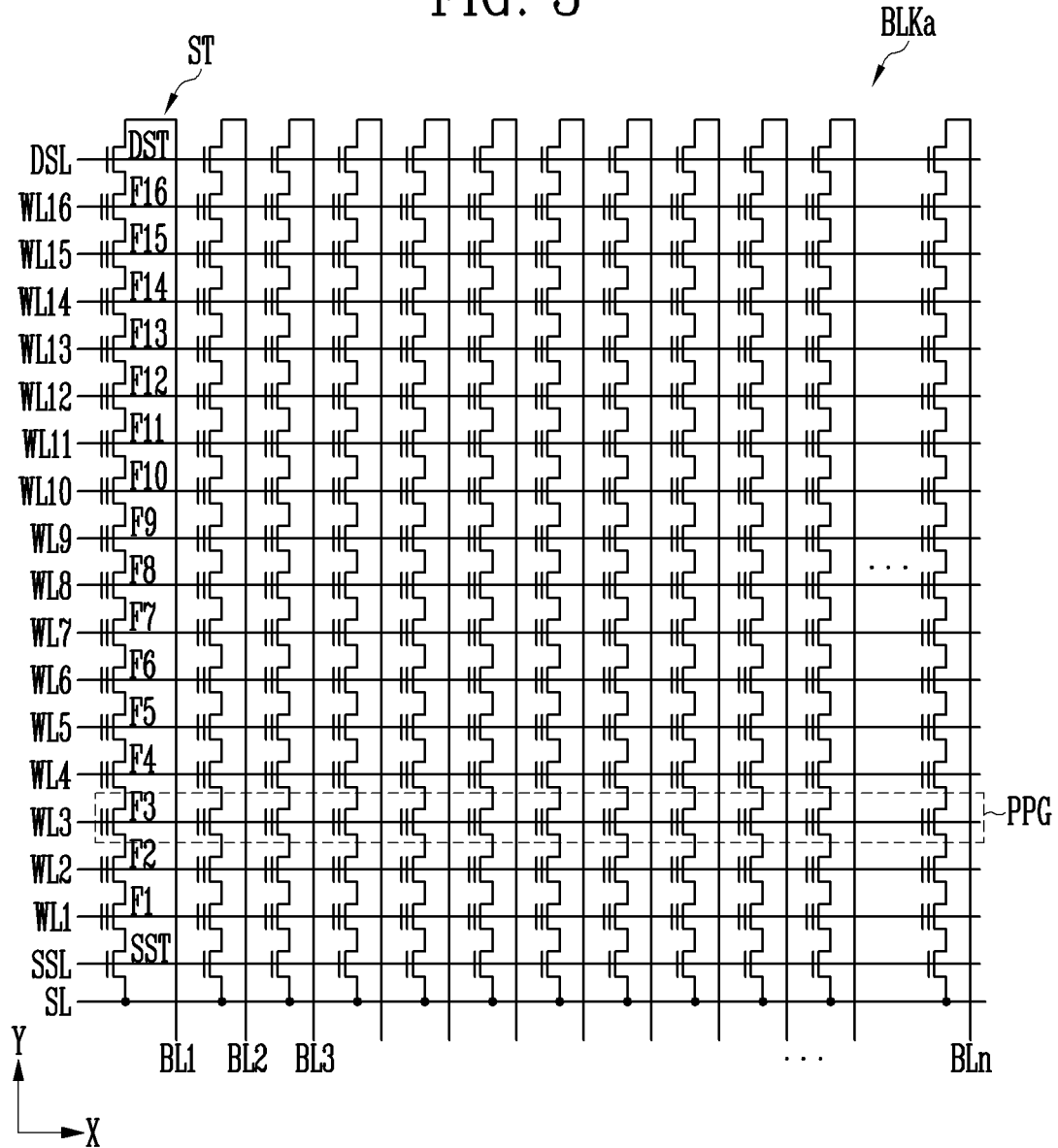
FIG. 3 is a diagram illustrating an embodiment of a memory cell array, such as that of FIG. 2.

FIG. 3 is a diagram illustrating an embodiment of the memory cell array of FIG. 2.

FIG. 3 is a circuit diagram showing a representative memory block BLKa among the plurality of memory blocks BLK1 to BLKz in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Since each of the strings may be configured the same, a string ST connected to the first bit line BL1 is specifically described, as an example.

The string ST may include a source select transistor SST, a plurality of memory cells F1 to F16, and a drain select transistor DST connected in series between the source line SL and the first bit line BL1. One string ST may include one or more of the source select transistor SST and the drain select transistor DST, and may include more than the 16 memory cells F1 to F16 shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the same number of physical pages PPG as word lines WL1 to WL16.

One memory cell may store one bit of data. This is commonly referred to as a single level cell (SLC). In this case, one physical page PPG may store one logical page (LPG) data. One logical page (LPG) data may include the same number of data bits as there are memory cells in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell has increased, the multi-level cell (MLC) in a more specific sense refers to a memory cell in which two bits of data is stored. In this case, a memory cell in which three or more bits of data are stored is referred to as a triple level cell (TLC), and a memory cell in which four bits of data are stored is referred to as a quadruple level cell (QLC). In addition, a memory cell method in which more than four bits of data are stored has been developed. Thus, more generally, the present invention may be applied to the memory device in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
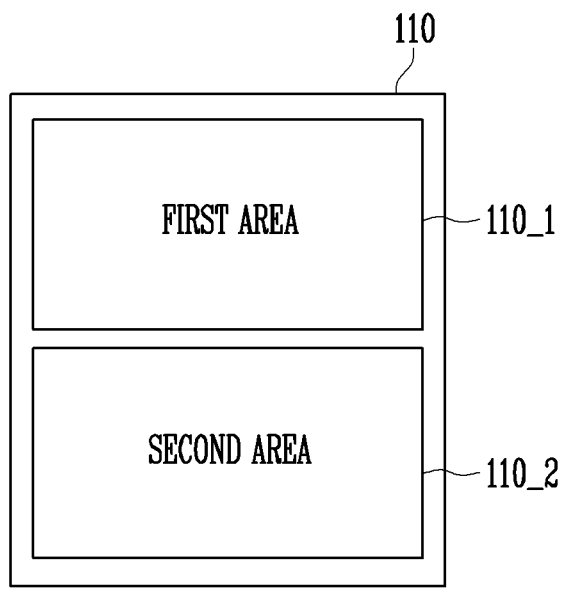
FIG. 4 is a diagram illustrating areas into which a memory cell array, such as that of FIG. 2, is divided according to a program mode.

FIG. 4 is a diagram illustrating areas into which the memory cell array of FIG. 2 is divided according to the program mode.

FIG. 4 shows areas into which the memory cell array 110 of FIG. 2 is divided. In FIG. 4, the memory cell array 110 may be divided into first and second areas 110_1 and 110_2, that is, two areas. In an embodiment, the first and second areas 110_1 and 110_2 may be the same or different sizes. More generally, the size of each area may be set to any suitable size.

In another embodiment, the memory cell array 110 of FIG. 2 may be divided into more than two areas. For example, the memory cell array 110 of FIG. 2 may be divided into three areas.

In an embodiment, the first area 110_1 may be an area in which data is programmed in the SLC method, and the second area 110_2 may be an area in which data is programmed in the TLC method.

The memory device 100 may initially program data stored in the page buffers PB1 to PBn of the page buffer group 123 into the second area 110_2 using the TLC method, and then program data stored in the page buffers PB1 to PBn into the first area 110_1 or the second area 110_2 based on a size of the data stored in the page buffers PB1 to PBn.

Specifically, based on the size of the data stored in the page buffers PB1 to PBn of the page buffer group 123, when the memory controller 200 sets the program mode to the SLC mode, the memory device 100 of FIG. 1 may program the data stored in the page buffers PB1 to PBn in the first area 110_1.

Alternatively, based on the size of the data stored in the page buffers PB1 to PBn, when the memory controller 200 sets the program mode to the TLC mode, the memory device 100 may program the data stored in the page buffers PB1 to PBn in the second area 110_2.

In an embodiment, the memory controller 200 may determine an address and a command based on the size of the data stored in the page buffers PB1 to PBn such that the data stored in the page buffers PB1 to PBn of the page buffer group 123 are programmed in the first area 110_1 or the second area 110_2. In addition, the memory controller 200 may transmit the determined address and command through a pin of the memory device.

Pins of the memory device are described in more detail with reference to FIG. 5.

Figure 5:
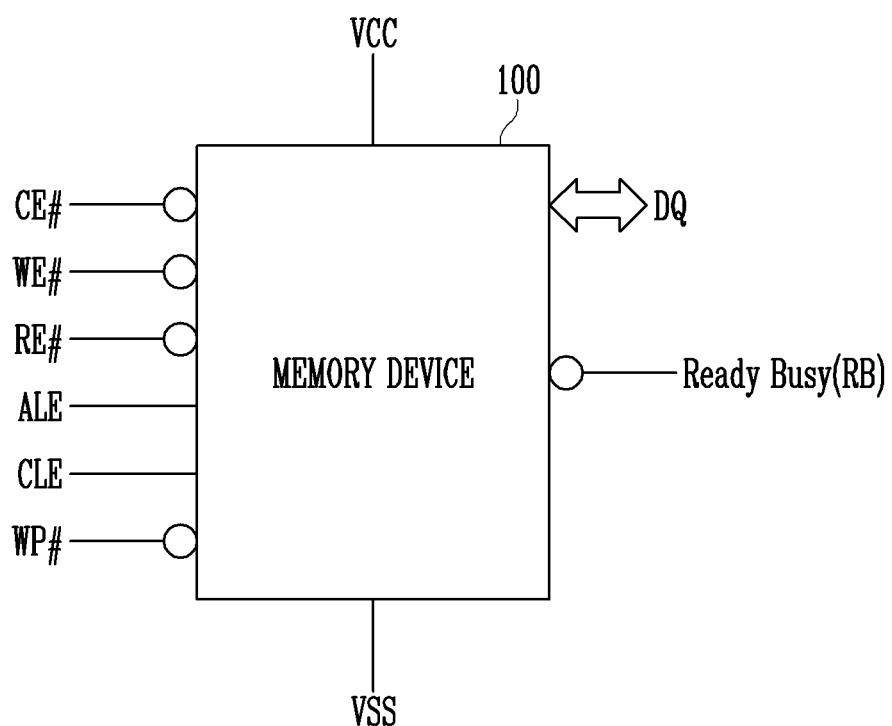
FIG. 5 is a diagram illustrating a pin configuration of a memory device, such as that of FIG. 1.

FIG. 5 is a diagram illustrating a pin configuration of the memory device 100 of FIG. 1.

Referring to FIG. 5, the memory device 100 may communicate with the memory controller 200 through a plurality of input/output lines. For example, the memory device 100 communicates with the memory controller 200 through data input/output lines DQ and control signal lines including a chip enable line CE #, a write enable line WE #, a read enable line RE #, an address latch enable line ALE, a command latch enable line CLE, a write protection line WP #, and a ready busy line RB.

The memory device 100 may receive a chip enable signal from the memory controller 200 through the chip enable line CE #. The memory device 100 may receive a write enable signal from the memory controller 200 through the write enable line WE #. The memory device 100 may receive a read enable signal from the memory controller 200 through the read enable line RE #. The memory device 100 may receive an address latch enable signal from the memory controller 200 through the address latch enable line ALE. The memory device 100 may receive a command latch enable signal from the memory controller 200 through the command latch enable line CLE. The memory device 100 may receive a write protection signal from the memory controller 200 through the write protection line WP #.

In an embodiment, the memory device 100 may provide a read busy signal outputting whether the memory device 100 is in a ready state or a busy state to the memory controller 200 through the ready busy line RB.

The chip enable signal may be a control signal for selecting the memory device 100. When the chip enable signal is in a 'high' state and the memory device 100 is in the 'ready' state, the memory device 100 may enter a low power standby state.

The write enable signal may be a control signal for controlling storage of the command, the address, and input data, which are input to the memory device 100, in a latch.

The read enable signal may be a control signal for enabling an output of serial data.

The address latch enable signal may be one of control signals used by the host to indicate whether a type of a signal input to the input/output lines DQ is a command, an address, or data.

The command latch enable signal may be one of control signals used by the host to indicate whether the type of the signal input to the input/output lines DQ is a command, an address, or data.

For example, when the command latch enable signal is activated (for example, logic high), the address latch enable signal is deactivated (for example, logic low), and the write enable signal is activated (for example, logic low) and then deactivated (for example, logic high), the memory device 100 may identify that the signal input through the input/output lines DQ may be the command.

For example, when the command latch enable signal is deactivated (for example, logic low), the address latch enable signal is activated (for example, logic high), and the write enable signal is activated (for example, logic low) and then deactivated (for example, logic high), the memory device 100 may identify that the signal input through the input/output lines DQ may be the address.

The write protection signal may be a control signal for deactivating the memory device 100 from performing the program operation and the erase operation.

The ready busy signal may be for identifying a state of the memory device 100. That is, the ready busy signal in a low state indicates that the memory device 100 is performing at least one operation. The ready busy signal in a high state indicates that the memory device 100 is not performing any operation.

The ready busy signal may be in the low state while the memory device 100 performs a program, erase and/or read operation. In an embodiment of the present disclosure, the memory controller 200 of FIG. 1 may determine the time at which an operation being performed, i.e., a program operation or erase operation, ended based on the ready busy signal.

Figure 6A:
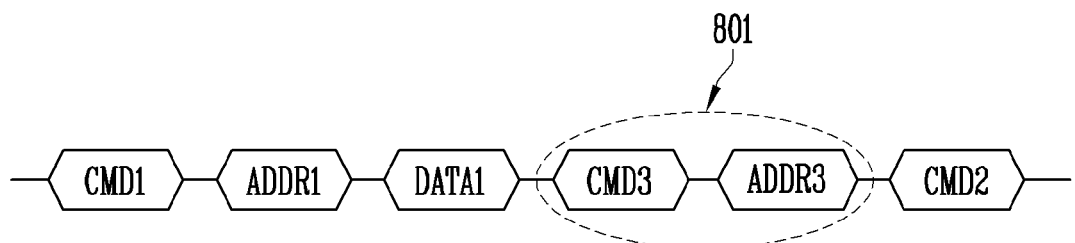
FIGS. 6A and 6B are diagrams for describing a command and/or an address received through input/output lines DQ to change a row address.
Figure 6B:
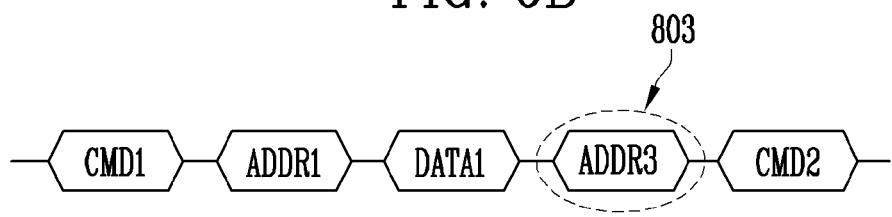

FIGS. 6A and 6B are diagrams for describing the command and/or the address received through the input/output lines DQ to change the row address.

FIG. 6A shows a case where the command and the address are received before receiving a confirm command to change the row address, and FIG. 6B shows a case where only the address is received before receiving the confirm command to change the row address.

In FIGS. 6A and 6B, a first command CMD1, a first address ADDR1, and first data DATA1 are sequentially received from the memory controller 200 through the input/output lines DQ of FIG. 5.

In an embodiment, the first command CMD1 may be a setup command, and a second command CMD2 may be the confirm command. The setup command may be for determining a method of programming data received from the memory controller 200, and the confirm command may be for instructing a start of an operation corresponding to the command determined by the setup command. The first address ADDR1 may include the column address and the row address. The first data DATA1 may be data to be programmed in the memory device 100.

In an embodiment, when the first command CMD1, the first address ADDR1, and the first data DATA1 are received from the memory controller 200, the first data DATA1 may be temporarily stored in the page buffer corresponding to the column address included in the first address ADDR1.

Thereafter, when the memory device 100 receives the second command CMD2 from the memory controller 200 through the input/output lines DQ of the memory device 100, that is, when the memory device 100 receives the confirm command, the memory device 100 may program the first data DATA1, which is stored in the page buffer, in the memory cell array 110. A method in which the first data DATA1 is programmed may be determined by the row address of the first address ADDR1.

However, referring to FIG. 6A, in order to store the first data DATA1 in a memory area different from a memory area corresponding to the row address in the first address ADDR1, the memory device 100 may receive an address change command and a change address from the memory controller 200 before receiving the confirm command.

For example, before receiving the second command CMD2, i.e., the confirm command, from the memory controller 200, the memory device 100 may receive a third command CMD3 and a third address ADDR3 (801). The third command CMD3 may be the address change command, and the third address ADDR3 may be the change address. The address change command may be for instructing to change the memory area in which data is stored based on the change address. By changing the memory area in which the first data DATA1 is to be stored based on the third command CMD3 and the third address ADDR3, the method of storing DATA1 is also changed.

In FIGS. 6A and 6B, only the row address may be included in the third address ADDR3, or both the row address and the column address may be included in the third address ADDR3. Since the third command CMD3 is the address change command for changing the row address, the memory area in which the first data DATA1 is to be stored may be determined based on only the row address regardless of whether or not the column address is included in the third address ADDR3.

Referring to FIG. 6B, before receiving the second command CMD2, that is, before receiving the confirm command, the third address ADDR3 for determining again the memory area in which the first data DATA1 is to be stored may be received from the memory controller 200. Differently from that described with respect to FIG. 6A, in FIG. 6B, in order to change the memory area in which the first data DATA1 is to be stored, the memory device 100 may not receive the address change command but may receive only the third address ADDR3, which is the change address (803).

Specifically, referring to FIG. 6B, as in FIG. 6A, the memory device 100 may sequentially receive the first command, the first address ADDR1, and the first data DATA1 from the memory controller 200 through the input/output lines DQ of the memory device 100.

However, differently from FIG. 6A, in order to change the row address determined by the first address ADDR1, that is, in order to change the memory area in which the first data DATA1 is to be stored, which is already determined, the memory device 100 may receive only the third address ADDR3 from the memory controller 200. The memory device 100 may change the memory area that was determined by the first address ADDR1 through the third address ADDR3.

As a result, referring to FIG. 6B, the memory area in which the first data DATA1 is to be stored may be changed, based on only the second command CMD2, that is, the third address ADDR3 received before receiving the confirm command.

Figure 7:
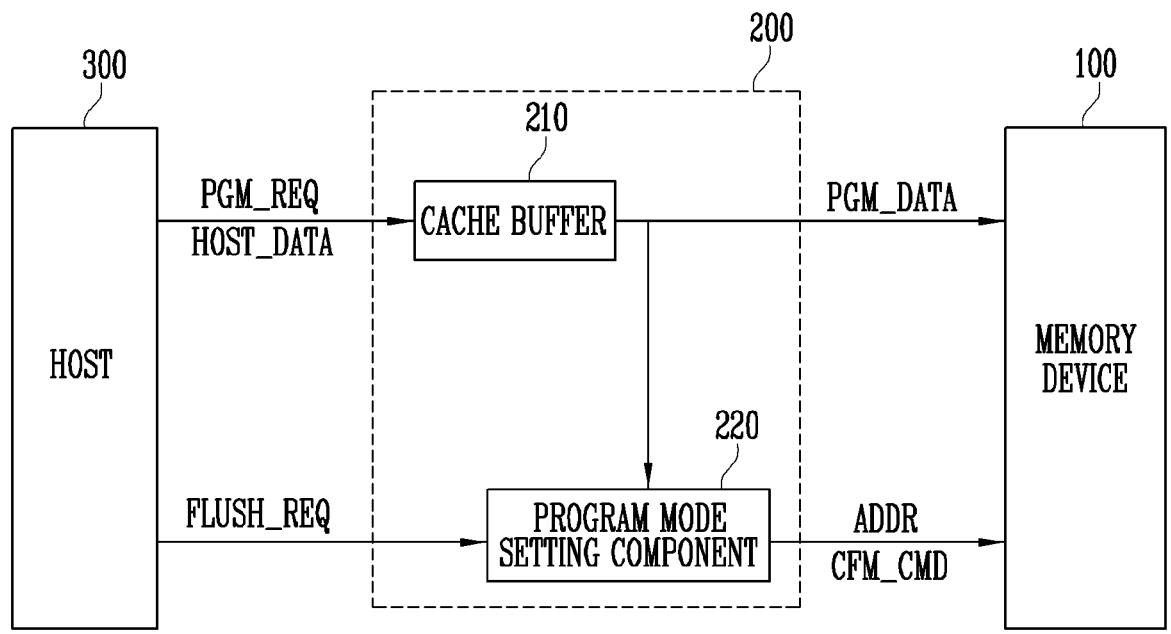
FIG. 7 is a diagram illustrating a configuration of a memory controller for determining a program mode based on data stored in page buffers.

FIG. 7 is a diagram illustrating a configuration of the memory controller for determining the program mode based on the data stored in the page buffers.

Referring to FIG. 7, the memory controller 200 may include a cache buffer 210 and a program mode setting component 220. It is assumed that the program mode setting component 220 knows in advance the size (capacity) of the page buffer in the memory device 100.

In an embodiment, the host 300 may output host data HOST_DATA to the memory controller 200 together with a program request PGM_REQ. The program request PGM_REQ may be for instructing the program operation to the memory device 100. In addition, the host data HOST_DATA may correspond to the program request PGM_REQ, and may be program data PGM_DATA to be programmed in the memory device 100.

When the host data HOST_DATA is received from the host 300, the cache buffer 210 may store the received host data HOST_DATA. The host data HOST_DATA stored in the cache buffer 210 may be output to the memory device 100 as the program data PGM_DATA. The host data HOST_DATA may be output in the order or sequence in which the host data HOST_DATA was stored in the cache buffer 210. When the program data PGM_DATA is output from the cache buffer 210, the program data PGM_DATA may be stored in the page buffer in the memory device 100.

In an embodiment, the program data PGM_DATA may be output to the program mode setting component 220 as well as the memory device 100. The program mode setting component 220 may determine the size of the data stored in the page buffer based on the size of the program data PGM_DATA from the cache buffer 210.

That is, since all data output from the cache buffer 210 is stored in the page buffer before all data output from the cache buffer 210 is programmed in the memory cell array 110, the size of the data stored in the page buffer may be determined based on the data output from the cache buffer 210.

In an embodiment, since the program mode setting component 220 knows in advance the size (capacity) of the page buffer, the program mode setting component 220 may know a residual size (residual capacity) of the page buffer based on the size of the data received from the cache buffer 210. That is, the program mode setting component 220 may determine the size of data that may be additionally stored in the page buffer.

The program mode setting component 220 may set the program mode based on the size of the data stored in the page buffer or the size of the data that may be additionally stored in the page buffer.

For example, during a first program operation, the program mode may be the TLC mode that performs the program operation in the TLC method. That is, a default mode may be the TLC mode.

However, when the data stored in the page buffer is or becomes a size that is programmable in the SLC method during the time that the memory device 100 performs the program operation (when the data that may be additionally stored in the page buffer is equal to or greater than two pages), the program mode setting component 220 may set the program mode to the SLC mode.

Conversely, when the data stored in the page buffer is not of a size that is programmable in the SLC method during the time that the memory device 100 performs the program operation (when the data that may be additionally stored in the page buffer is equal to or less than one page), the program mode setting component 220 may set the program mode to, or keep the program mode at, the TLC mode, i.e., the default mode.

In an embodiment, the host 300 may output a flush request FLUSH_REQ to the memory controller 200. The flush request FLUSH_REQ may instruct that all data stored in the page buffer be programmed in the memory cell array 110.

For example, when the host 300 does not output the flush request FLUSH_REQ, that is, when the memory controller 200 does not receive the flush request FLUSH_REQ from the host 300, the program mode may be changed to the SLC mode or may be maintained as the TLC mode according to the size of the data stored in the page buffer at the time at which the program operation is performed.

However, when the host 300 outputs the flush request FLUSH_REQ, that is, when the memory controller 200 receives the flush request FLUSH_REQ from the host 300, the program mode setting component 220 may determine the size of the data stored in the page buffer at a time at which the flush request FLUSH_REQ is received.

Thereafter, the program mode setting component 220 may determine the program mode based on the size of the data stored in the page buffer. That is, the program mode setting component 220 may determine an address ADDR and a confirm command CFM_CMD to be output to the memory device 100, based on the size of the data stored in the page buffer. The address ADDR output by the program mode setting component 220 based on the size of the data stored in the page buffer may be the third address ADDR3 (as indicated in FIGS. 6A and 6B), and the confirm command CFM_CMD may be the second command CMD2 of FIGS. 6A and 6B.

In an embodiment, as a result of determining the size of the data stored in the page buffer by receiving the flush request FLUSH_REQ from the host 300, the size of the data may be the size programmable in the SLC method. When the size of the data is the size programmable in the SLC method, the program mode setting component 220 may set the program mode to the SLC mode.

Specifically, in the SLC mode, the program mode setting component 220 may output the address ADDR for selecting the first area 110_1 of the first and second areas 110_1 and 110_2 of the memory cell array 110, and the confirm command CFM_CMD for instructing performance of the program operation in the SLC method. When the address ADDR and the confirm command CFM_CMD are received from the program mode setting component 220, the memory device 100 may program the data, which is stored in the page buffer, in the first area 110_1 in the SLC method.

In another embodiment, as a result of determining the size of the data stored in the page buffer by receiving the flush request FLUSH_REQ from the host 300, the data may not be of the size programmable in the SLC method. When the data is not of the size programmable in the SLC method, the program mode setting component 220 may set the program mode to the TLC mode.

Specifically, the program mode setting component 220 may output the address ADDR for selecting the second area 110_2 of the first and second areas 110_1 and 110_2 of the memory cell array 110, and the confirm command CFM_CMD for instructing performance of the program operation in the TLC method. Thereafter, when the address ADDR and the confirm command CFM_CMD are received from the program mode setting component 220, the memory device 100 may program the data, which is stored in the page buffer, in the second area 110_2 in the TLC method.

As a result, when the memory controller 200 does not receive the flush request FLUSH_REQ from the host 300, the program mode may be set based on the size of the data stored in the page buffer at the time at which the memory device 100 performs the program operation. However, when the memory controller 200 receives the flush request FLUSH_REQ from the host 300, the program mode may be set based on the size of the data stored in the page buffer at the time at which the flush request FLUSH_REQ is received.

FIG. 8 is a diagram illustrating data transmission between the host, the memory controller, and the memory device of FIG. 1.

Referring to FIG. 8, the host (HOST) may be configured the same as the host 300 of FIG. 1, the memory controller (MEMORY CONTROLLER) may be configured the same as the memory controller 200 of FIG. 1, and the memory device (MEMORY DEVICE) may be configured the same as the memory device 100 of FIG. 1.

FIG. 8 shows a series of processes in which data output from the host is stored in the first to n-th page buffers PB1 to PBn of the memory device. In FIG. 8, it is assumed that the host data output from the host is output in a sequence or order of first to sixth host data, i.e., HOST_DATA1 to HOST_DATA6.

In an embodiment, the first to sixth host data may be output from the host. The host data may be data corresponding to the program request output from the host, and may be data to be programmed in the memory device.

The host data output from the host may be stored in a cache buffer (CACHE BUFFER) included in the memory controller. HOST_DATA1 to HOST_DATA6 may be sequentially stored in the cache buffer.

In an embodiment, data stored in the cache buffer may be output to the memory device as the program data. Program data PGM_DATA1 to PGM_DATA6 output to the memory device may be sequentially output in a sequence in which the PGM_DATA1 to PGM_DATA6 are stored in the cache buffer.

PGM_DATA1 to PGM_DATA6 output from the cache buffer may be stored in the first to n-th page buffers PB1 to PBn of the memory device.

In an embodiment, the size of HOST_DATA1 to HOST_DATA6 output from the host may be 4 Kbytes. Therefore, a unit of the host data, i.e., each of HOST_DATA1 to 6 output from the host and each of the program data, i.e., each of PGM_DATA1 to PGM_DATA6 output from the cache buffer may be 4 Kbytes.

However, the program data stored in the page buffers PB1 to PBn may be programmed in a unit of 8 Kbytes. That is, since the data stored in the page buffers PB1 to PBn are programmed in the memory cell array 110 in a page unit, the size of the data programmed at once during the program operation may be 8 Kbytes, that is the size of one page.

For example, when the memory device performs the program operation in the TLC method, the memory device may program the data of the memory cell array 110 by performing the program operation on a least significant bit (LSB) page of 8 Kbyte size, a center significant bit (CSB) page of 8 Kbyte size, and a most significant bit (MSB) page of 8 Kbyte size, that is, three pages. That is, when the size of the data stored in the page buffers PB1 to PBn is not a size programmable as one page, the memory device may perform the program operation in the TLC method in the TLC mode.

In another embodiment, when the data stored in the first to n-th page buffers PB1 to PBn is of the size that may be programmed as one page (when first program data PGM_DATA1 and/or second program data PGM_DATA2 are/is stored), the memory device may perform the program operation in the SLC method in the SLC mode. That is, the memory device may program the data in the memory cell array 110 by performing the program operation on one page of 8 Kbyte size.

A method of setting the program mode based on the size of the data stored in the first to n-th page buffers PB1 to PBn, that is, a method of determining a method of performing the program operation is described in more detail with reference to FIGS. 9A, 9B and 9C.

Figures 9A, 9B, 9C, 10:
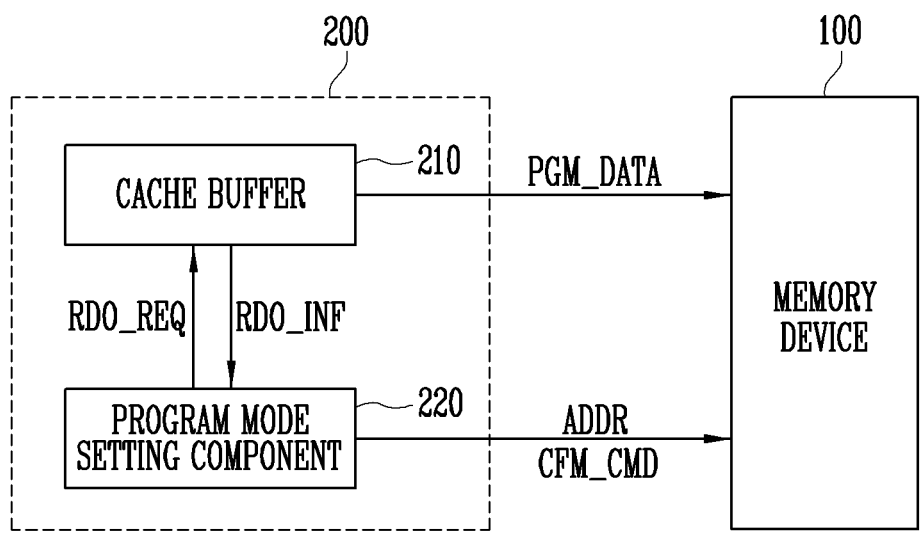
FIGS. 9A, 9B and 9C are diagrams illustrating a method of determining a program mode based on a size of the data stored in page buffers.
FIG. 10 is a diagram illustrating a method of determining a program mode when a flush request is not received from a host.

FIGS. 9A, 9B and 9C are diagrams illustrating the method of determining the program mode based on the size of the data stored in the page buffers.

FIGS. 9A, 9B and 9C illustrate the data stored in the first to n-th page buffers PB1 to PBn of FIG. 8. Similarly to FIG. 8, in FIG. 9, it is assumed that each of the program data PGM_DATA1 to PGM_DATA6 is a 4 Kbyte unit, and the size of the pages (LSB page, CSB page, and MSB page) that are units in which the program operation is performed is 8 Kbytes.

Referring to FIG. 9A, the data stored in the page buffer may be first and second program data PGM_DATA1 and 2 at a time at which the memory device 100 performs the program operation or at a time at which the flush request is received from the host 300.

In this case, the data stored in the first to n-th page buffers PB1 to PBn may be of the size programmable as one page. Therefore, at the time at which the memory device 100 performs the program operation or at the time at which the flush request is received from the host 300, the program mode setting component 220 may change the program mode from TLC mode that is the default mode to the SLC mode.

Thereafter, the program mode setting component 220 may output an address and a confirm command for programming in the SLC method. The output address may be for selecting the first area 110_1 of FIG. 4 and the confirm command may be the command for instructing the performance of the program operation in the SLC method.

After receiving the address for selecting the first area 110_1 and the confirm command for instructing the performance of the program operation in the SLC method from the program mode setting component 220, the memory device 100 may program the first and second program data PGM_DATA1 and 2 in the first area 110_1 in the SLC method.

In another embodiment, when the data stored in the page buffer is only the first program data PGM_DATA1 at the time at which the memory device 100 performs the program operation or at the time at which the flush request is received from the host 300, similar to the above, the memory device 100 may program the first program data in the first area 110_1 in the SLC method.

Referring to FIG. 9B, at the time at which the memory device 100 performs the program operation or at the time at which the flush request is received from the host 300, the data stored in the page buffer may be first to third program data PGM_DATA1 to 3. In addition, referring to FIG. 9C, at the time at which the memory device 100 performs the program operation or at the time at which the flush request is received from the host 300, the data stored in the page buffer may be first to fifth program data PGM_DATA1 to 5.

In a case of FIGS. 9B and 9C, the data stored in the first to n-th page buffers PB1 to PBn may not be of the size programmable as one page. Therefore, in FIGS. 9B and 9C, at the time at which the memory device 100 performs the program operation or at the time at which the flush request is received from the host 300, the program mode setting component 220 may maintain the program mode as TLC mode, which is the default mode.

Thereafter, the program mode setting component 220 may output an address and a confirm command for programming in the TLC method. The output address may be for selecting the second area 110_2 of FIG. 4 and the confirm command may be the command for instructing the performance of the program operation in the TLC method.

After receiving the address for selecting the second area 110_2 and the confirm command for instructing the performance of the program operation in the TLC method from the program mode setting component 220, the memory device 100 may program the first to third program data PGM_DATA1 to 3 or the first to fifth program data PGM_DATA1 to 5 in the second area 110_2 in the TLC method.

FIG. 10 is a diagram illustrating a method of determining the program mode when the flush request is not received from the host.

Referring to FIG. 10, the memory controller 200 may include the cache buffer 210 and the program mode setting component 220. The cache buffer 210 may receive and store the host data from the host 300 and output the stored host data as the program data PGM_DATA. The program mode setting component 220 may set the program mode for programming data in the memory device 100. The program mode setting component 220 may output the address ADDR designating an area in which the data is to be programmed and the confirm command CFM_CMD for determining a program method according to the set program mode.

In FIG. 10, since the memory controller 200 does not received the flush request from the host 300 of FIG. 1, FIG. 10 shows operation of the memory controller 200 at a time at which the program operation is performed. The time at which the program operation is performed may mean a time at which all data is stored in the page buffer of the memory device 100 or a time at which the performance of the program operation is determined by an internal operation of the memory controller 200.

In an embodiment, at the time at which the program operation is performed, the program mode setting component 220 may output a residual data output request RDO_REQ to the cache buffer 210. The residual data output request RDO_REQ may be a request for outputting all data stored in the cache buffer 210.

In response to the residual data output request RDO_REQ, the data stored in the cache buffer 210 may be output to the memory device 100 as the program data PGM_DATA. The program data PGM_DATA output to the memory device 100 may be stored in the page buffer.

When all data stored in the cache buffer 210 is output, residual data output information RDO_INF indicating a size of the data output from the cache buffer 210 may be output. That is, the residual data output information RDO_INF may be information indicating the size of the data output from the cache buffer 210 to the memory controller 200.

After receiving the residual data output information RDO_INF, the program mode setting component 220 may determine the size of the program data PGM_DATA output from the cache buffer 210 to the memory device 100. The program data PGM_DATA output from the cache buffer 210 may include not only the program data PGM_DATA output by the residual data output request RDO_REQ but also the program data PGM_DATA output from the cache buffer 210 before receiving the residual data output request RDO_REQ.

Thereafter, the program mode setting component 220 may set the program mode based on the size of the program data PGM_DATA output from the cache buffer 210. That is, based on the size of the data stored in the page buffer of the memory device 100, the program mode setting component 220 may maintain the program mode as the TLC mode, which is the default mode, or change the program mode to the SLC mode.

When the program mode is maintained as the TLC mode, the program mode setting component 220 may output the address ADDR for selecting the second area 110_2 of the memory cell array 110 of FIG. 4, and the confirm command CFM_CMD for instructing to perform the program operation in the TLC method.

When the program mode is changed to the SLC mode, the program mode setting component 220 may output the address ADDR for selecting the first area 110_1 of the memory cell array 110 of FIG. 4, and the confirm command CFM_CMD for instructing to perform the program operation in the SLC method.

Figure 11:
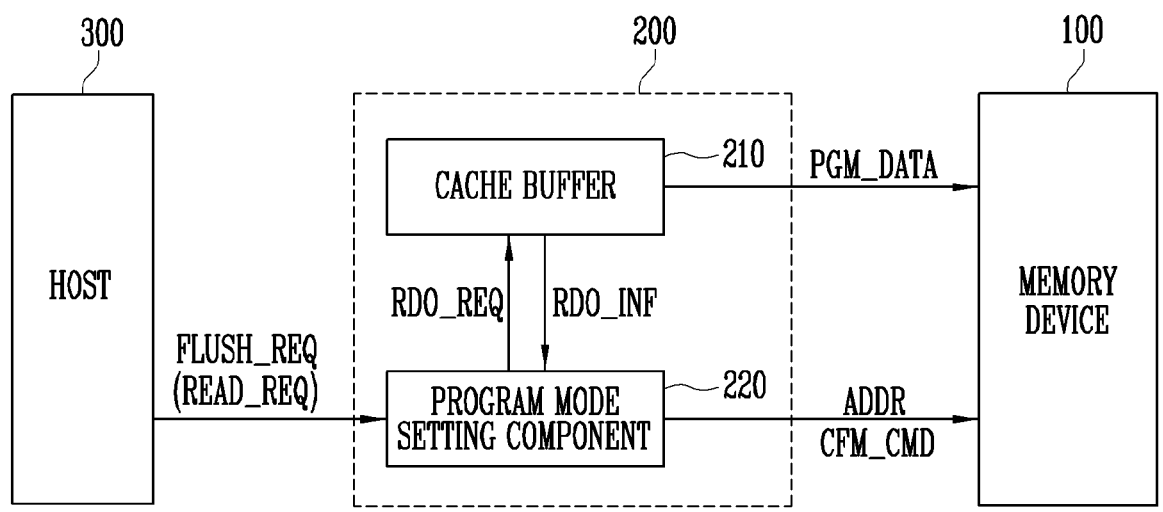
FIG. 11 is a diagram illustrating a method of determining a program mode when a flush request or a read request is received from a host.

FIG. 11 is a diagram illustrating the method of determining the program mode when the flush request or the read request is received from the host.

Unlike the configuration shown and described with respect to FIG. 10, FIG. 11 shows a case where the memory controller 200 receives the flush request FLUSH_REQ or the read request READ_REQ from the host 300. Also in a case where the memory controller 200 receives the flush request FLUSH_REQ from the host 300 as well as the read request READ_REQ, the program mode setting component 220 sets the program mode in the same method. Hereinafter, a case where the memory controller 200 receives the flush request FLUSH_REQ from the host 300 is described as an example.

In FIG. 11, the memory controller 200 may include the cache buffer 210 and the program mode setting component 220.

In an embodiment, the host 300 may output the flush request FLUSH_REQ or the read request READ_REQ. The flush request FLUSH_REQ may be for outputting the data stored in the cache buffer 210 of the memory controller 200 to the memory device 100 and performing the program operation. The read request READ_REQ may be for instructing to read specific data stored in the memory device 100.

In an embodiment, while the memory controller 200 is transmitting data to the memory device 100, the host 300 may output the flush request FLUSH_REQ to the program mode setting component 220. The program mode setting component 220 may output the residual data output request RDO_REQ to the cache buffer 210 in response to the flush request FLUSH_REQ. The residual data output request RDO_REQ may be for outputting all data stored in the cache buffer 210.

In response to the residual data output request RDO_REQ, the data stored in the cache buffer 210 may be output to the memory device 100 as the program data PGM_DATA. The program data PGM_DATA output to the memory device 100 may be stored in the page buffer.

When all data stored in the cache buffer 210 is output, the residual data output information RDO_INF indicating the size of the data output from the cache buffer 210 may be output. That is, the residual data output information RDO_INF may be information indicating the size of the data output from the cache buffer 210 to the memory controller 200.

After receiving the residual data output information RDO_INF, the program mode setting component 220 may determine the size of the program data PGM_DATA output from the cache buffer 210 to the memory device 100. The program data PGM_DATA output from the cache buffer 210 may include not only the program data PGM_DATA output by the residual data output request RDO_REQ but also the program data PGM_DATA output from the cache buffer 210 before receiving the residual data output request RDO_REQ.

Thereafter, the program mode setting component 220 may set the program mode based on the size of the program data PGM_DATA output from the cache buffer 210. That is, based on the size of the data stored in the page buffer of the memory device 100, the program mode setting component 220 may maintain the program mode as the TLC mode, which is the default mode, or change the program mode to the SLC mode.

When the program mode is maintained as the TLC mode, the program mode setting component 220 may output the address ADDR for selecting the second area 110_2 of the memory cell array 110 of FIG. 4, and the confirm command CFM_CMD for instructing to perform the program operation in the TLC method.

When the program mode is changed to the SLC mode, the program mode setting component 220 may output the address ADDR for selecting the first area 110_1 of the memory cell array 110 of FIG. 4, and the confirm command CFM_CMD for instructing to perform the program operation in the SLC method.

In an embodiment, while the memory controller 200 is transmitting data to the memory device 100, the host 300 may output the read request READ_REQ to the program mode setting component 220. The program mode setting component 220 may perform the operation for programming the data stored in the page buffer of the memory device 100 and the data stored in the cache buffer 210 in order to perform an operation corresponding to the read request READ_REQ.

Specifically, when the program mode setting component 220 receives the read request READ_REQ, the program mode setting component 220 may output the residual data output request RDO_REQ to the cache buffer 210. The residual data output request RDO_REQ may be for outputting all data stored in the cache buffer 210. That is, in order to preferentially program the data stored in the cache buffer 210 before outputting data corresponding to the read request READ_REQ to the host 300, the program mode setting component 220 may output the residual data output request RDO_REQ.

Thereafter, the program mode setting component 220 may set the program mode based on the size of the program data PGM_DATA output from the cache buffer 210. The program mode may be set to the TLC mode or the SLC mode. Since the operation after the setting of the program mode is the same as in the case where the host 300 outputs the flush request FLUSH_REQ, description thereof is omitted here.

Figure 12:
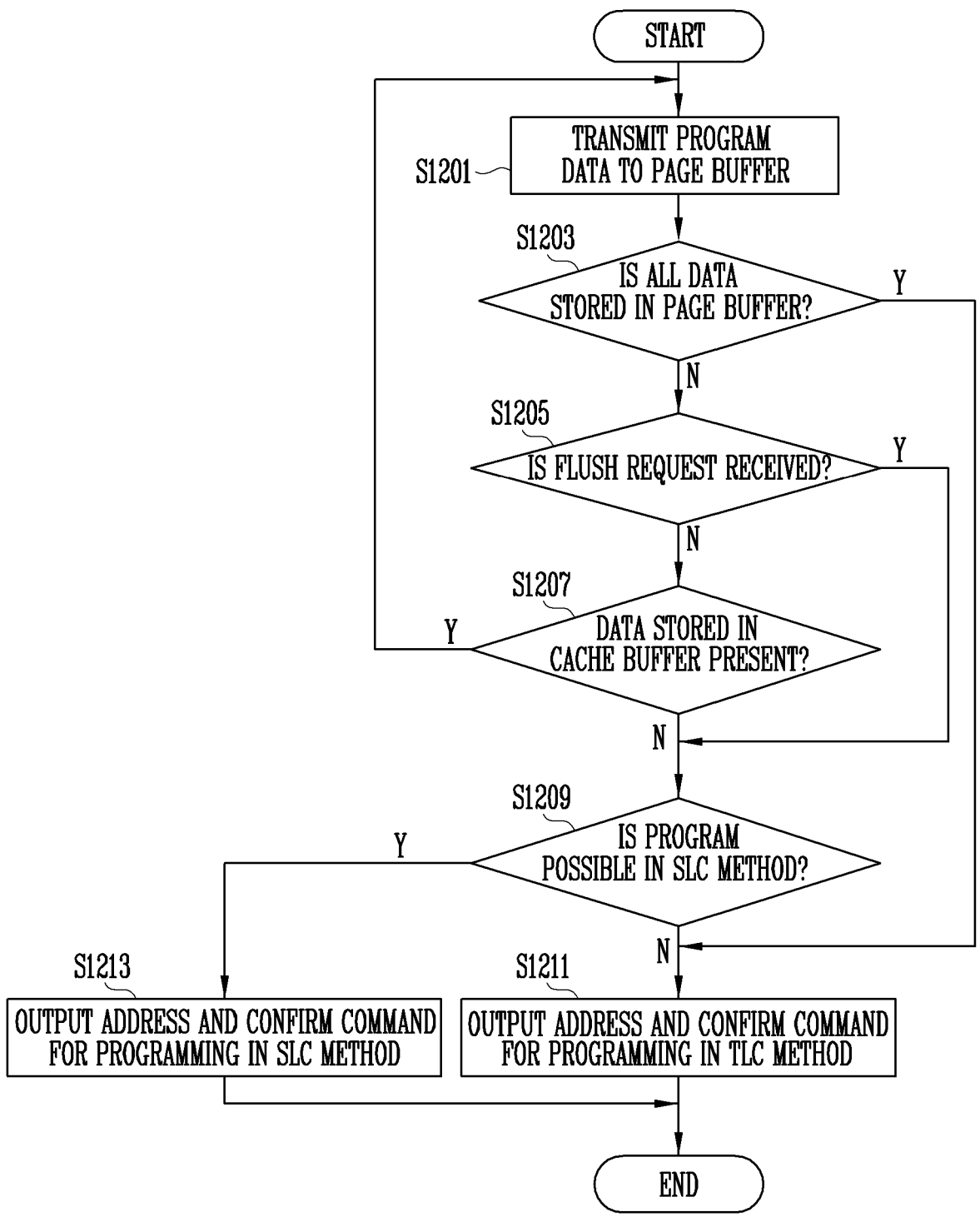
FIG. 12 is a diagram for describing an operation of the memory controller according to an embodiment of the present disclosure.

FIG. 12 is a flow diagram for describing the operation of the memory controller according to an embodiment of the present disclosure.

Referring to FIG. 12, in step S1201, the memory controller may transmit the program data to the page buffer in the memory device. The program data may be data transmitted from the host, and may be the data stored in the cache buffer and then output.

In step S1203, the memory controller may determine whether all data is stored in the page buffer. That is, the memory controller may set the program mode based on whether all data is stored in the page buffer.

When all the data is stored in the page buffer (Y at S1203), the memory controller may internally determine the performance of the program operation and may output the address and the confirm command for programming the data in the TLC method (S1211).

Specifically, when all data is stored in the page buffer, since the memory device may not program all data by programming one page only, the memory controller may maintain the TLC mode, which is the default mode. The memory controller may output the address for selecting an area programmed in the TLC method in the TLC mode, and the confirm command for instructing to perform the program operation in the TLC method.

However, when not all data is stored in the page buffer (N at S1203), the memory controller may determine whether a flush request is received from the host (S1205). When the memory controller does not receive the flush request from the host (N at S1205), the process proceeds to step S1207. When the memory controller receives the flush request from the host (Y at 1205), the process proceeds to step S1209.

In step S1207, the memory controller may determine whether there is data stored in the cache buffer. Specifically, when not all data is stored in the page buffer and the memory controller does not receive the flush request from the host, the memory controller may determine whether data is present in the cache buffer. The program mode for outputting the data stored in the cache buffer or programming the data stored in the page buffer of the memory device may be determined, by determining whether data is present in the cache buffer.

For example, when data is present in the cache buffer (Y at S1207), the memory controller may proceed to step S1201 to transmit the data stored in the cache buffer to the page buffer as the program data. However, when no data is present in the cache buffer (N at S1207), the memory controller may determine whether the data stored in the page buffer is programmable in the SLC method (S1209).

When the data stored in the cache buffer is programmable in the SLC method (Y at S1209), the memory controller may output the address and the confirm command for programming the data in the SLC method (S1213).

Specifically, that the data is programmable in the SLC method means that the memory device may program all data by programming one page. Therefore, when the data is programmable in the SLC method, the memory controller may change the program mode from the TLC mode to the SLC mode. The memory controller may output the address for selecting an area programmed in the SLC method in the SLC mode, and the confirm command for instructing to perform the program operation in the SLC method.

When the data stored in the cache buffer is not programmable in the SLC method (N at S1209), the memory controller may output the address and the confirm command for programming the data in the TLC method (S1211).

As described above, the memory controller may output the address for selecting the area programmed in the TLC method in the TLC mode, and the confirm command for instructing to perform the program operation in the TLC method.

Figure 13:
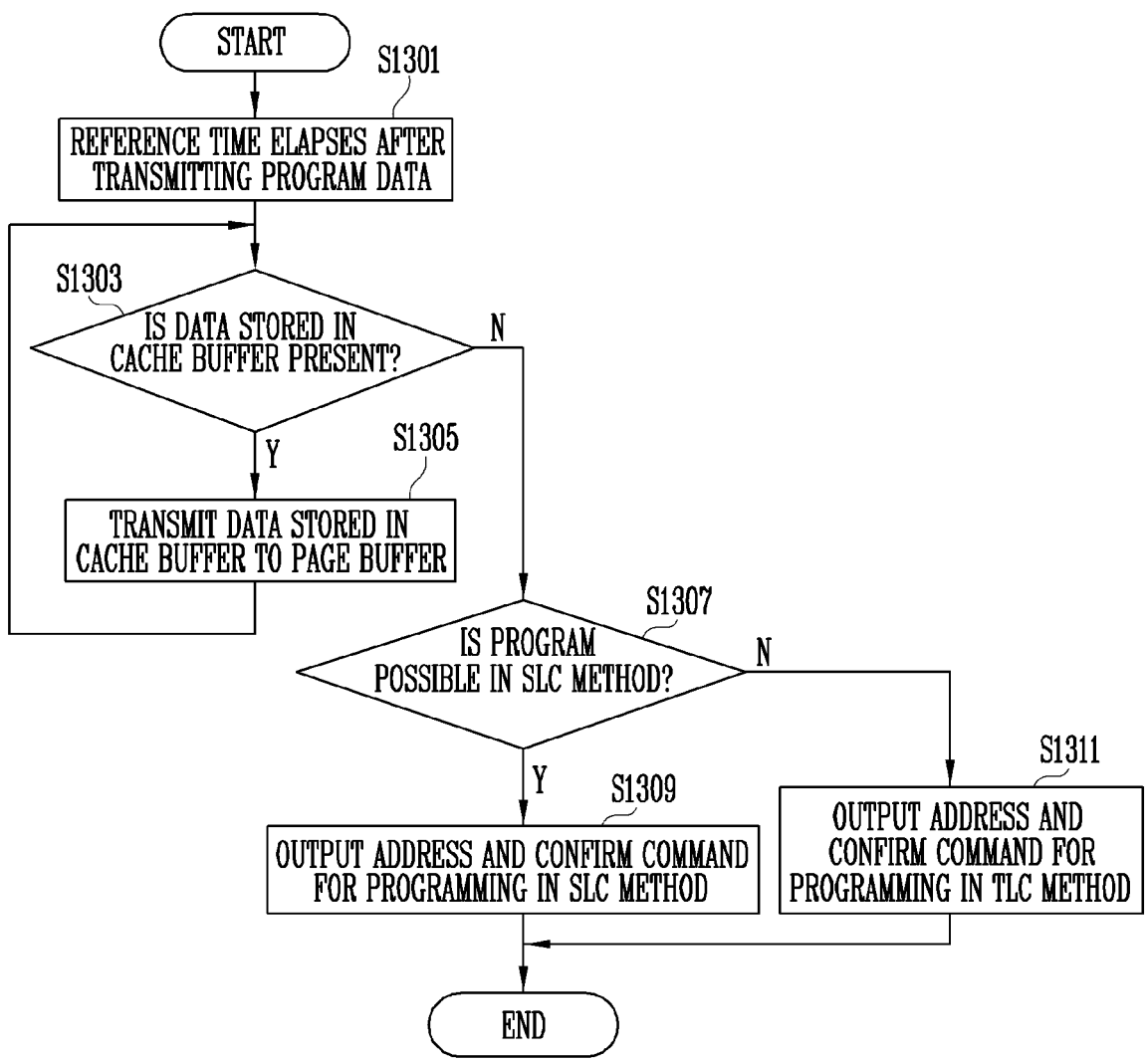
FIG. 13 is a flow diagram for describing an operation of a memory controller according to an embodiment of the present disclosure.

FIG. 13 is a flow diagram for describing the operation of the memory controller according to an embodiment of the present disclosure.

Referring to FIG. 13, in step S1301, after the memory controller transmits the program data to the memory device, a reference time elapses. Specifically, after the data that is transmitted from the host and stored in the cache buffer in the memory controller, the program data is output from the cache buffer, from the time of that output, the reference time elapses. During the reference time no additional data may be output from the cache buffer.

After the reference time elapses, the memory controller may determine whether there is still data stored in the cache buffer (S1303).

In an embodiment, when it is determined that data remains in the cache buffer (Y at S1303), the memory controller may transmit data stored in the cache buffer to the page buffer (S1305). After data stored in the cache buffer is transmitted to, and stored in, the page buffer, the memory controller may again determine whether any data remains in the cache buffer (S1303). That is, the memory controller keeps checking whether any data remains in the cache buffer until the determination yields a "no" answer.

In an embodiment, when it is determined that no data remains in the cache buffer (N at S1303), the memory controller may determine whether the data is programmable in the SLC method (S1307). That is, the memory controller may determine whether the data stored in the page buffer in the memory device is programmable as one page. When all data is programmable as one page, the memory controller may control the memory device to perform the program operation in the SLC method.

Specifically, when the data is programmable in the SLC method (Y at S1307), the memory controller may output the address and the confirm command for programming in the SLC method (S1309).

For example, the memory controller may change the program mode from the TLC mode to the SLC mode. In addition, the memory controller may output the address for selecting the area programmed in the SLC method in the SLC mode, and the confirm command for instructing to perform the program operation in the SLC method.

In an embodiment, when the data is not programmable in the SLC method (N at S1307), the memory controller may output the address and the confirm command for programming in the TLC method (S1311).

For example, the memory controller may maintain the program mode as the TLC mode or, if currently in the SLC mode, change from the SLC mode to the TLC mode. In addition, the memory controller may output the address for selecting the area programmed in the TLC method in the TLC mode, and the confirm command for instructing to perform the program operation in the TLC method.

Figure 14:
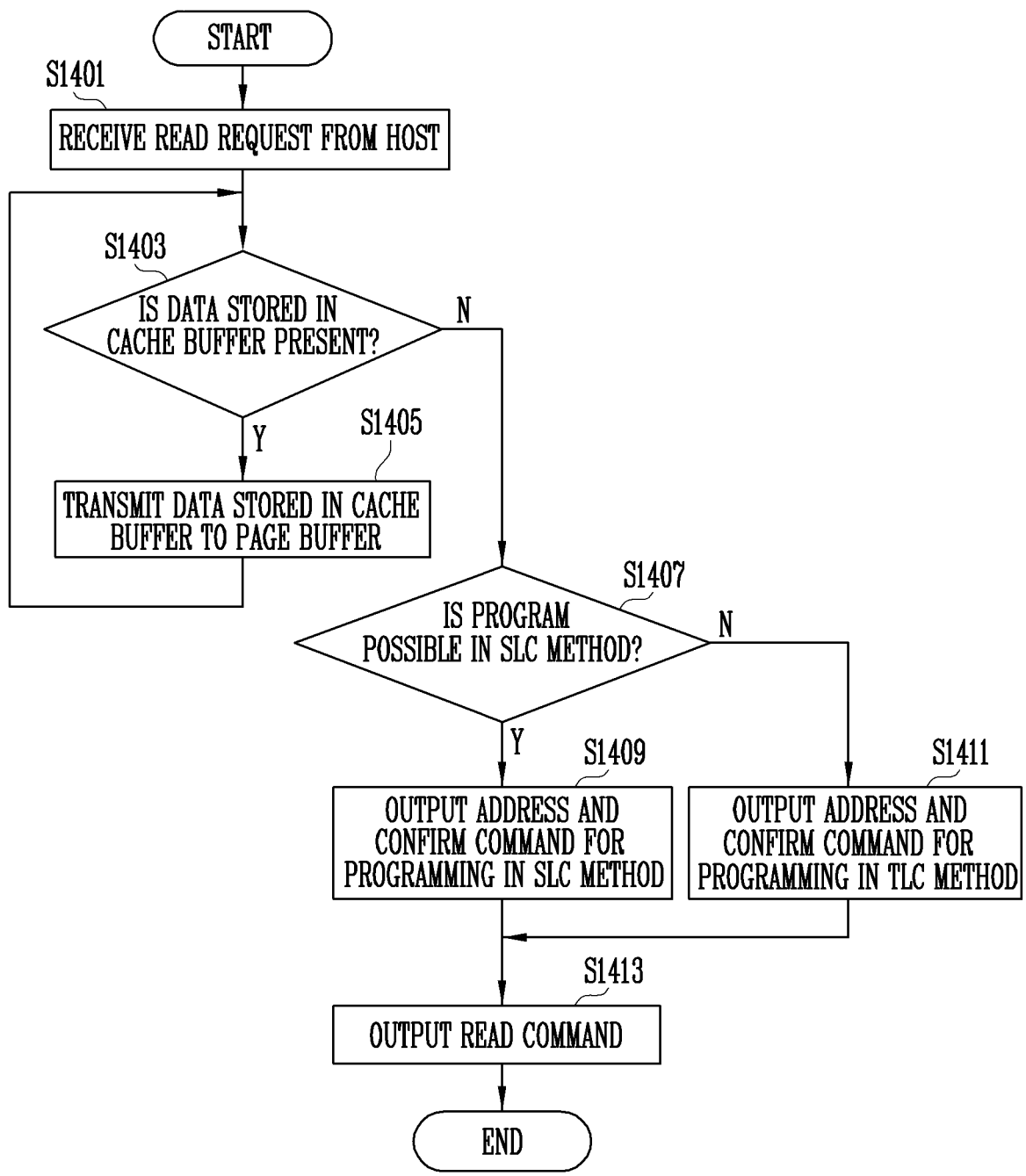
FIG. 14 is a flow diagram for describing an operation of s memory controller according to an embodiment of the present disclosure.

FIG. 14 is a flow diagram for describing the operation of the memory controller according to an embodiment of the present disclosure.

Referring to FIG. 14, in step S1401, the memory controller may receive the read request from the host. The read request may that data stored in a specific area of the memory device be read. When data is present in the cache buffer, the data stored in the cache buffer is preferentially programmed. Therefore, the memory controller may perform the operation for programming the data stored in the cache buffer.

In step S1403, the memory controller may determine whether data is present in the cache buffer.

In an embodiment, when data is present in the cache buffer (Y at S1403), the memory controller may transmit the data stored in the cache buffer to the page buffer (S1405). After data stored in the cache buffer is transmitted to, and stored in, the page buffer, the memory controller may again determine whether any data remains in the cache buffer (S1403). That is, as long as it determined that data remains in the cache buffer, the memory controller may transmit data stored in the cache buffer to the page buffer.

In an embodiment, when no data remains in the cache buffer (N at S1403), the memory controller may determine whether the data is programmable in the SLC method (S1407). That is, the memory controller may determine whether the data stored in the page buffer in the memory device is programmable as one page. When all data is programmable as one page, the memory controller may control the memory device to perform the program operation in the SLC method.

Specifically, when the data is programmable in the SLC method (Y at S1407), the memory controller may output the address and the confirm command for programming in the SLC method (S1409).

For example, the memory controller may change the program mode from the TLC mode to the SLC mode. In addition, the memory controller may output the address for selecting the area programmed in the SLC method in the SLC mode, and the confirm command for instructing to perform the program operation in the SLC method.

In an embodiment, when the data is not programmable in the SLC method (N at S1409), the memory controller may output the address and the confirm command for programming in the TLC method (S1411).

For example, the memory controller may maintain the program mode as the TLC mode or, if currently in the SLC mode, change from the SLC mode to the TLC mode. In addition, the memory controller may output the address for selecting the area programmed in the TLC method in the TLC mode, and the confirm command for instructing that the program operation in the TLC method be performed.

In an embodiment, when the address and the confirm command for programming in the SLC method or the address and the confirm command for programming in the TLC method are output (S1409 or S1411), the memory controller may output a read command (S1413). That is, when all data stored in the cache buffer is output and programmed, data is not present in the cache buffer any more. Therefore, the read command may be output to the memory device since the read operation may be performed.

When the read command is output to the memory device, the memory device may perform an operation corresponding to the read command. That is, data stored in a specific area may be output to the memory controller.

Figure 15:
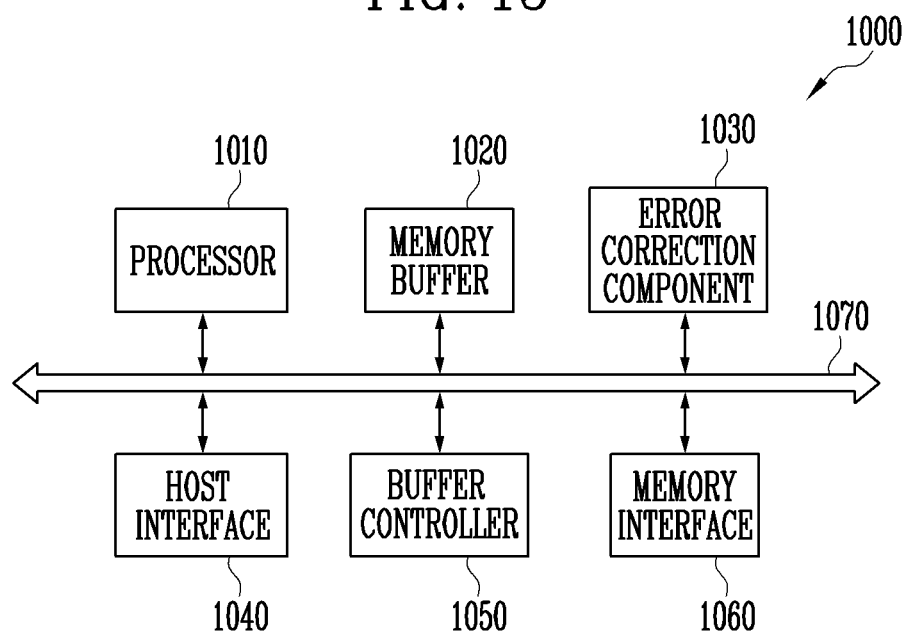
FIG. 15 is a diagram illustrating another embodiment of a memory controller, such as that of FIG. 1.

FIG. 15 is a diagram illustrating another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 15, the memory controller 1000 may include a processor 1010, a memory buffer 1020, an error correction component (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. Examples of address mapping methods include a page mapping method, a block mapping method, and a hybrid mapping method.

In an embodiment, the processor 1010 may receive data to be programmed in the memory device 100 from the host 300, and store the received data in the memory buffer 1020. The data stored in the memory buffer 1020 may be output to the memory device 100 in the sequence in which the data is stored in the memory buffer 1020. The data output to the memory device 100 may be stored in the page buffer of the memory device 100.

Thereafter, the processor 1010 may determine to perform a program operation by an internal operation or after receiving a flush command from the host 300. When the processor 1010 determines to perform the program operation, the processor 1010 may determine the program mode based on the data stored in the page buffer.

Specifically, when the size of the data stored in the page buffer is programmable as one page, the processor 1010 may maintain the program mode as the TLC mode which is the default mode. The processor 1010 may output the address and the confirm command for performing the program operation in the TLC method in the TLC mode.

However, when the size of the data stored in the page buffer is not programmable as one page, the processor 1010 may change the program mode from the TLC mode to the SLC mode. The processor 1010 may output the address and the confirm command for performing the program operation in the SLC method in the SLC mode.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction component 1030 may perform error correction. The error correction component 1030 may perform error correction encoding (ECC encoding) based on data to be written to the memory device through memory interface 1060. The error correction encoded data may be transferred to the memory device through the memory interface 1060. The error correction component 1030 may perform error correction decoding (ECC decoding) on the data received from the memory device through the memory interface 1060. For example, the error correction component 1030 may be included in the memory interface 1060 as a component of the memory interface 1060.

The host interface 1040 is configured to communicate with an external host under control of the processor 1010. The host interface 1040 may be configured to perform communication using at least one of various communication methods such as an universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), an universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050. One or both of the memory buffer 1020 and buffer controller 1050 may be provided separately, or one or both of their functions may be distributed to other component(s) of the memory controller 1000.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with, nor affect each other. The data bus may be connected to the host interface 1040, the buffer controller 1050, the error correction component 1030, and the memory interface 1060. The control bus may be connected to the host interface 1040, the processor 1010, the buffer controller 1050, the memory buffer 1020, and the memory interface 1060.

Figure 16:
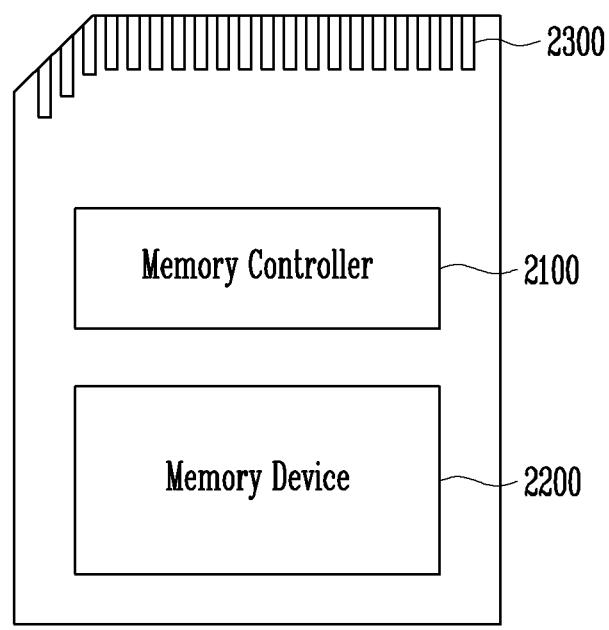
FIG. 16 is a block diagram illustrating a memory card system to which a storage device is applied according to an embodiment of the present disclosure.

FIG. 16 is a block diagram illustrating a memory card system to which the storage device is applied according to an embodiment of the present disclosure.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented with the memory device 100 of FIG. 1.

As an example, the memory controller 2100 may include components such as a random access memory (RAM), a processor, a host interface, a memory interface, and an error correction component.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as an universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, an universal flash storage (UFS), Wi-Fi, Bluetooth, and/or an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-torque magnetic RAM (STT-MRAM).

In an embodiment, the memory controller 2100 may receive data to be programmed in the memory device 2200 from the host 300, and store the received data. The data stored in the memory controller 2100 may be output to the memory device 2200 in a sequence in which the data is stored in the memory controller 2100. The data output to the memory device 2200 may be stored in a page buffer of the memory device 2200.

Thereafter, the memory controller 2100 may determine to perform the program operation by an internal operation or after receiving the flush command from the host 300. When the memory controller 2100 determines to perform the program operation, the memory controller 2100 may determine the program mode based on the data stored in the page buffer.

Specifically, when the size of the data stored in the page buffer is programmable as one page, the memory controller 2100 may maintain the program mode as the TLC mode which is the default mode. The memory controller 2100 may output the address and the confirm command for performing the program operation in the TLC method in the TLC mode.

However, when the size of the data stored in the page buffer is not programmable as one page, the memory controller 2100 may change the program mode from the TLC mode to the SLC mode. The memory controller 2100 may output the address and the confirm command for performing the program operation in the SLC method in the SLC mode.

The memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMC-micro, or eMMC), an SD card (SD, miniSD, microSD, or SDHC), and/or an universal flash storage (UFS).

Figure 17:
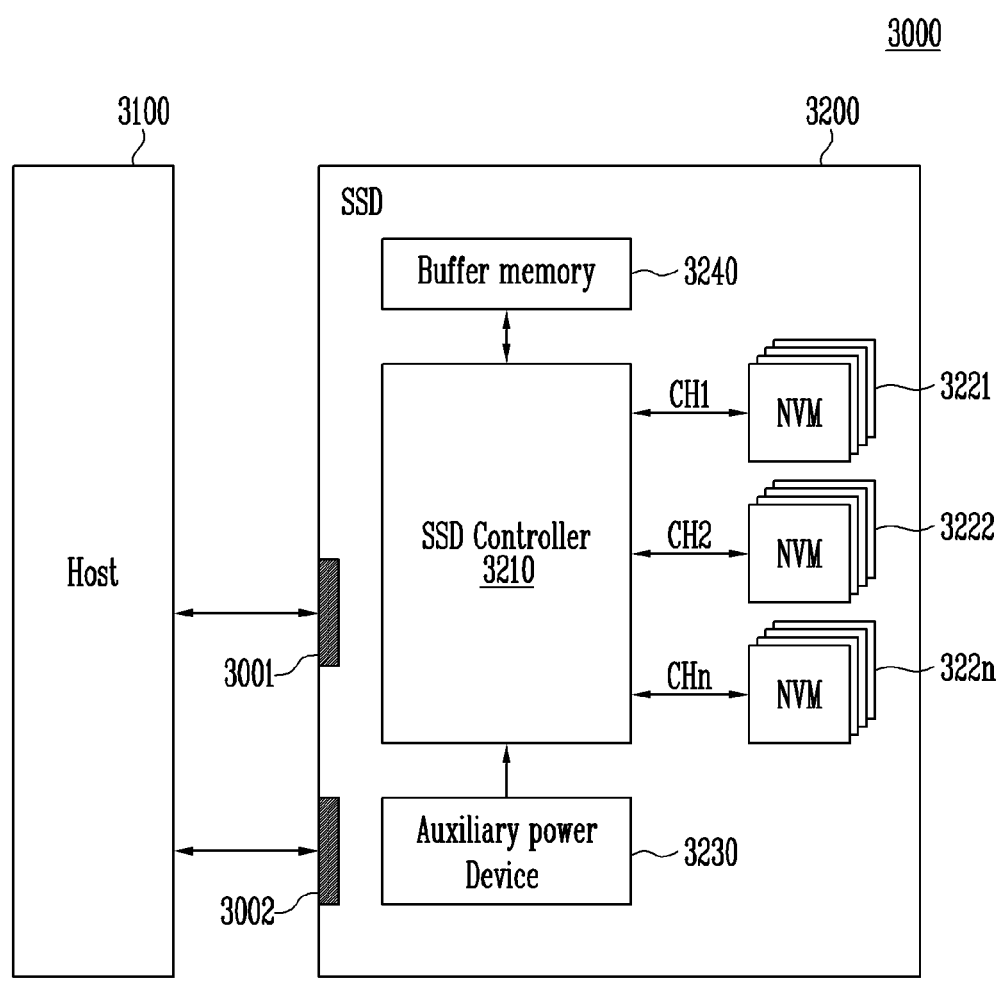
FIG. 17 is a block diagram illustrating a solid state drive (SSD) system to which s storage device is applied according to an embodiment of the present disclosure.

FIG. 17 is a block diagram illustrating a solid state drive (SSD) system to which the storage device is applied according to an embodiment of the present disclosure.

Referring to FIG. 17, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322$n$, an auxiliary power device 3230, and a buffer memory 3240.

In an embodiment, the SSD controller 3210 may perform functions of the memory controller 200 of FIG. 1.

The SSD controller 3210 may control the plurality of flash memories 3221 to 322$n$ in response to the signal SIG received from the host 3100. As an example, the signal SIG may be signals based on an interface between the host 3100 and the SSD 3200. For example, the signal SIG may be defined by at least one of interfaces such as an universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, an universal flash storage (UFS), Wi-Fi, Bluetooth, and/or an NVMe.

In an embodiment, the SSD controller 3210 may receive data to be programmed in the plurality of flash memories 3221 to 322$n$ from the host 300, and store the received data. The data stored in the SSD controller 3210 may be output to the plurality of flash memories 3221 to 322$n$ in a sequence in which the data is stored in the SSD controller 3210. The data output to the plurality of flash memories 3221 to 322$n$ may be stored in a page buffer of the plurality of flash memories 3221 to 322$n$.

Thereafter, the SSD controller 3210 may determine to perform the program operation by an internal operation or after receiving the flush command from the host 300 of FIG. 1. When the SSD controller 3210 determines to perform the program operation, the SSD controller 3210 may determine the program mode based on the data stored in the page buffer.

Specifically, when the size of the data stored in the page buffer is programmable as one page, the SSD controller 3210 may maintain the program mode as the TLC mode which is the default mode. The SSD controller 3210 may output the address and the confirm command for performing the program operation in the TLC method in the TLC mode.

However, when the size of the data stored in the page buffer is not programmable as one page, the SSD controller 3210 may change the program mode from the TLC mode to the SLC mode. The SSD controller 3210 may output the address and the confirm command for performing the program operation in the SLC method in the SLC mode.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be within or externally to the SSD 3200. For example, the auxiliary power device 3230 may be disposed on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and/or a PRAM.

Figure 18:
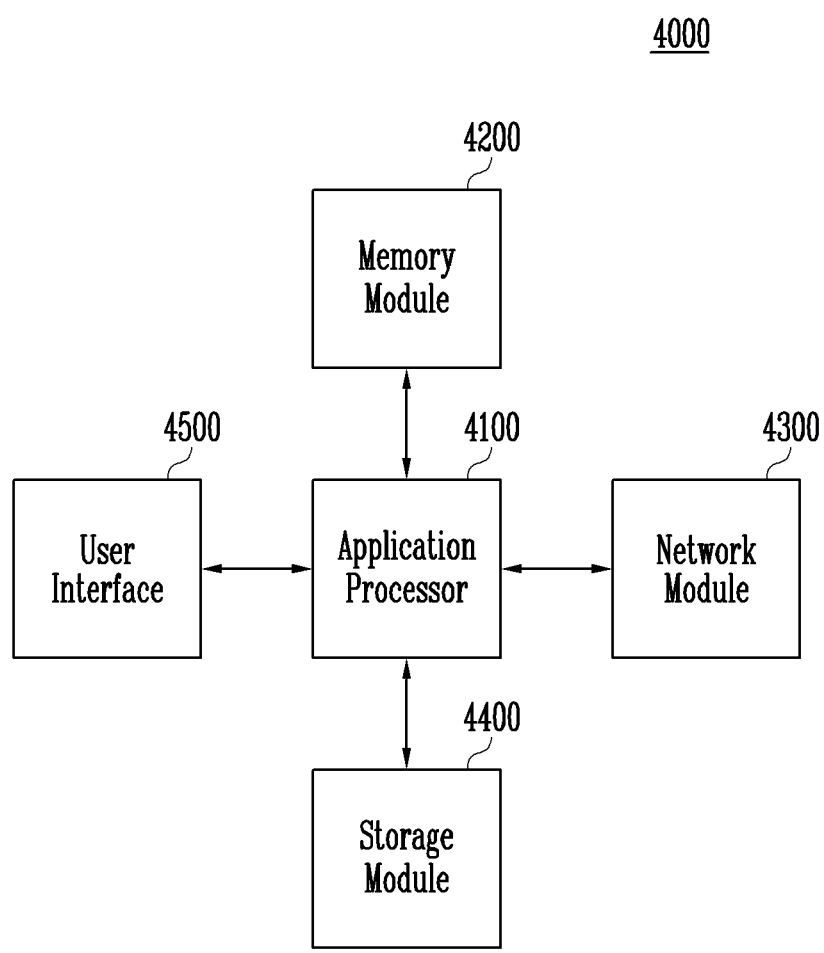
FIG. 18 is a block diagram illustrating a user system to which a storage device is applied according to an embodiment of the present disclosure.

FIG. 18 is a block diagram illustrating a user system to which the storage device is applied according to an embodiment of the present disclosure.

Referring to FIG. 18, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

In an embodiment, the application processor 4100 may receive data to be programmed in the storage module 4400 from the host 300 of FIG. 1 and store the received data. The data stored in the application processor 4100 may be output to the storage module 4400 in a stored sequence. The data output to the storage module 4400 may be stored in a page buffer of the storage module 4400.

Thereafter, the application processor 4100 may determine to perform the program operation by an internal operation or after receiving the flush command from the host 300. When the application processor 4100 determines to perform the program operation, the application processor 4100 may determine the program mode based on the data stored in the page buffer.

Specifically, when the size of the data stored in the page buffer is programmable as one page, the application processor 4100 may maintain the program mode as the TLC mode which is the default mode. The application processor 4100 may output the address and the confirm command for performing the program operation in the TLC method in the TLC mode.

However, when the size of the data stored in the page buffer is not programmable as one page, the application processor 4100 may change the program mode from the TLC mode to the SLC mode. The application processor 4100 may output the address and the confirm command for performing the program operation in the SLC method in the SLC mode.

The memory module 4200 may operate as a main memory, an operation memory, a buffer memory, or a cache memory of the user system 4000. The memory module 4200 may include a volatile random access memory such as a DRAM, a SDRAM, a DDR SDRAM, a DDR2 SDRAM, a DDR3 SDRAM, a LPDDR SDARM, a LPDDR2 SDRAM, and/or a LPDDR3 SDRAM, or a non-volatile random access memory, such as a PRAM, a ReRAM, a MRAM, and/or a FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and/or a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, each of which may operate identically to the memory device described with reference to FIGS. 2 and 3. The storage module may operate identically to the storage module 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and/or a piezoelectric element. The user interface 4500 may include user output interfaces such as a liquid crystal display (LCD), an organic light emitting diode (OLED) display device, an active matrix OLED (AMOLED) display device, a LED, a speaker, and a monitor.

What is claimed is:

1. A memory controller that controls a memory device, the memory controller comprising:
   a cache buffer configured to store data received from a host and output the data to the memory device in response to a data output request for outputting the data stored during a reference time; and
   a program mode setting component configured to:
   determine a program mode based on a size of the data output from the cache buffer to the memory device, and
   output an address and a command according to the determined program mode,
   wherein the program mode is a number of data bits stored in one memory cell.

2. The memory controller of claim 1, wherein when the reference time elapses after the data is output from the cache buffer, the memory controller controls the memory device to perform a program operation with the output data.

3. The memory controller of claim 1,
wherein the program mode setting component outputs to the cache buffer a residual data output request for outputting the data from the cache buffer to the memory device, and
wherein the cache buffer outputs to the program mode setting component residual data output information, which is information on the size of the data output from the cache buffer, in response to the residual data output request.

4. The memory controller of claim 3, wherein the program mode setting component determines the program mode based on a size of the data output from the cache buffer before outputting the residual data output request and a size of the data output from the cache buffer in response to the residual data output request.

5. The memory controller of claim 4,
wherein when the size of the data output from the cache buffer exceeds one page in size, the program mode setting component sets the program mode to a triple level cell mode that programs three bits of data per memory cell, and
wherein when the size of the data output from the cache buffer is equal to or less than the one page in size, the program mode setting component sets the program mode to a single level cell mode that programs one bit of data per memory cell.

6. The memory controller of claim 5, wherein when the program mode is set to the triple level cell mode, the program mode setting component outputs, to the memory device, an address for selecting an area in which to store data in the triple level cell mode among storage areas of the memory device, and a command instructing to program three bits of data per memory cell.

7. The memory controller of claim 5, wherein when the program mode is set to the single level cell mode, the program mode setting component outputs, to the memory device, an address for selecting an area in which to store data in the single level cell mode among storage areas of the memory device and a command instructing to program one bit of data per memory cell.

8. The memory controller of claim 1,
wherein when the program mode setting component receives a flush request from the host, the program mode setting component outputs a residual data output request for outputting the data from the cache buffer to the memory device, and
wherein the cache buffer outputs to the program mode setting component residual data output information, which is information on the size of the data output from the cache buffer, in response to the residual data output request.

9. The memory controller of claim 8, wherein the program mode setting component determines the program mode based on a size of the data output from the cache buffer before outputting the residual data output request and a size of the data output from the cache buffer in response to the residual data output request.

10. The memory controller of claim 9,
wherein when the size of the data output from the cache buffer exceeds one page in size, the program mode setting component sets the program mode to a triple level cell mode that programs three bits of data per memory cell, and
wherein when the size of the data output from the cache buffer is equal to or less than the one page in size, the program mode setting component sets the program mode to a single level cell mode that programs one bit of data per memory cell.

11. The memory controller of claim 1,
wherein when the program mode setting component receives a read request from the host, the program mode setting component outputs a residual data output request for outputting the data from the cache buffer to the memory device, and
wherein the cache buffer outputs to the program mode setting component residual data output information, which is information on the size of the data output from the cache buffer, in response to the residual data output request.

12. The memory controller of claim 11, wherein the program mode setting component determines the program mode based on a size of the data output from the cache buffer before outputting the residual data output request and a size of the data output from the cache buffer in response to the residual data output request.

13. The memory controller of claim 12, wherein when all data output to the memory device is programmed according to the program mode, the memory controller outputs to the memory device a command instructing the memory device to perform a read operation corresponding to the read request.

14. A method of operating a memory controller that controls a memory device, the method comprising:
storing data received from a host;
outputting the data stored during a reference time to the memory device;
determining a program mode based on a size of the data output to the memory device; and
outputting to the memory device an address and a command according to the determined program mode,
wherein the program mode is a number of data bits stored in one memory cell.

15. The method of claim 14, wherein when the reference time elapses after the data is output to the memory device, the memory device is controlled to perform a program operation according to the determined program mode.

16. The method of claim 14, wherein the outputting of the data includes outputting, after the reference time elapses since the data was output to the memory device, residual data to the memory device, the residual data being a portion of the data.

17. The method of claim 16, wherein the determining includes determining the program mode based on a size of the data output to the memory device before outputting the residual data and a size of the data output to the memory device after outputting the residual data.

18. The method of claim 17, wherein the determining includes:
determining, when the size of the data output to the memory device exceeds one page in size, the program mode is set to a triple level cell mode that programs three bits of data per memory cell, and
determining, when the size of the data output to the memory device is equal to or less than the one page in size, the program mode is set to a single level cell mode that programs one bit of data per memory cell.

19. The method of claim 18, wherein the outputting of the address and the command includes outputting to the memory device, when the program mode is set to the triple level cell mode, an address for selecting an area in which to store data in the triple level cell mode among storage areas of the memory device, and a command instructing to program three bits of data per memory cell.

20. The method of claim 18, wherein the outputting of the address and the command includes outputting to the memory device, when the program mode is set to the single level cell mode, an address for selecting an area in which to store data in the single level cell mode among storage areas of the memory device, and a command instructing to program one bit of data per memory cell.

\* \* \* \* \*